(12) United States Patent
Sim

(10) Patent No.: US 9,559,145 B2
(45) Date of Patent: Jan. 31, 2017

(54) ELECTRONIC DEVICE AND METHOD FOR FABRICATING THE SAME

(71) Applicant: SK hynix Inc., Icheon-Si (KR)

(72) Inventor: Joon-Seop Sim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 272 days.

(21) Appl. No.: 14/323,962

(22) Filed: Jul. 3, 2014

(65) Prior Publication Data

US 2015/0263071 A1    Sep. 17, 2015

(30) Foreign Application Priority Data

Mar. 11, 2014  (KR) ........................ 10-2014-0028323

(51) Int. Cl.
| | |
|---|---|
| H01L 27/24 | (2006.01) |
| G06F 13/28 | (2006.01) |
| H01L 43/08 | (2006.01) |
| H01L 45/00 | (2006.01) |
| H01L 27/22 | (2006.01) |
| G06F 12/0846 | (2016.01) |
| G06F 12/08 | (2016.01) |

(52) U.S. Cl.
CPC .......... *H01L 27/2463* (2013.01); *G06F 13/28* (2013.01); *H01L 27/228* (2013.01); *H01L 43/08* (2013.01); *H01L 45/04* (2013.01); *H01L 45/06* (2013.01); *H01L 45/1233* (2013.01); *H01L 45/141* (2013.01); *H01L 45/146* (2013.01); *H01L 45/147* (2013.01); *G06F 12/0846* (2013.01)

(58) Field of Classification Search
CPC .... H01L 27/228; H01L 27/2463; H01L 45/04; H01L 45/06; H01L 45/1233; H01L 45/141; H01L 45/146; H01L 45/147; H01L 43/08; G06F 12/0846; G06F 13/28
See application file for complete search history.

(56) References Cited

U.S. PATENT DOCUMENTS

| | | | | |
|---|---|---|---|---|
| 2006/0209585 A1* | 9/2006 | Tanizaki | ................ | G11C 11/56 365/148 |
| 2009/0040802 A1* | 2/2009 | Arakawa | ................ | B82Y 10/00 365/51 |

(Continued)

FOREIGN PATENT DOCUMENTS

KR    10-0997288 B1    11/2010

*Primary Examiner* — Eric Oberly
(74) *Attorney, Agent, or Firm* — Perkins Coie LLP

(57) ABSTRACT

Provided is an electronic device including a semiconductor memory which includes a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other.

20 Claims, 14 Drawing Sheets

(56) References Cited

U.S. PATENT DOCUMENTS

| | | | |
|---|---|---|---|
| 2011/0235403 A1* | 9/2011 | Kang | G11C 13/0004 |
| | | | 365/148 |
| 2012/0063196 A1* | 3/2012 | Kim | G11C 13/0004 |
| | | | 365/148 |
| 2014/0071741 A1* | 3/2014 | Kim | G11C 11/16 |
| | | | 365/158 |
| 2014/0233305 A1* | 8/2014 | Kim | G11C 11/1673 |
| | | | 365/158 |
| 2014/0319590 A1* | 10/2014 | Nakatsuka | H01L 27/228 |
| | | | 257/295 |

* cited by examiner

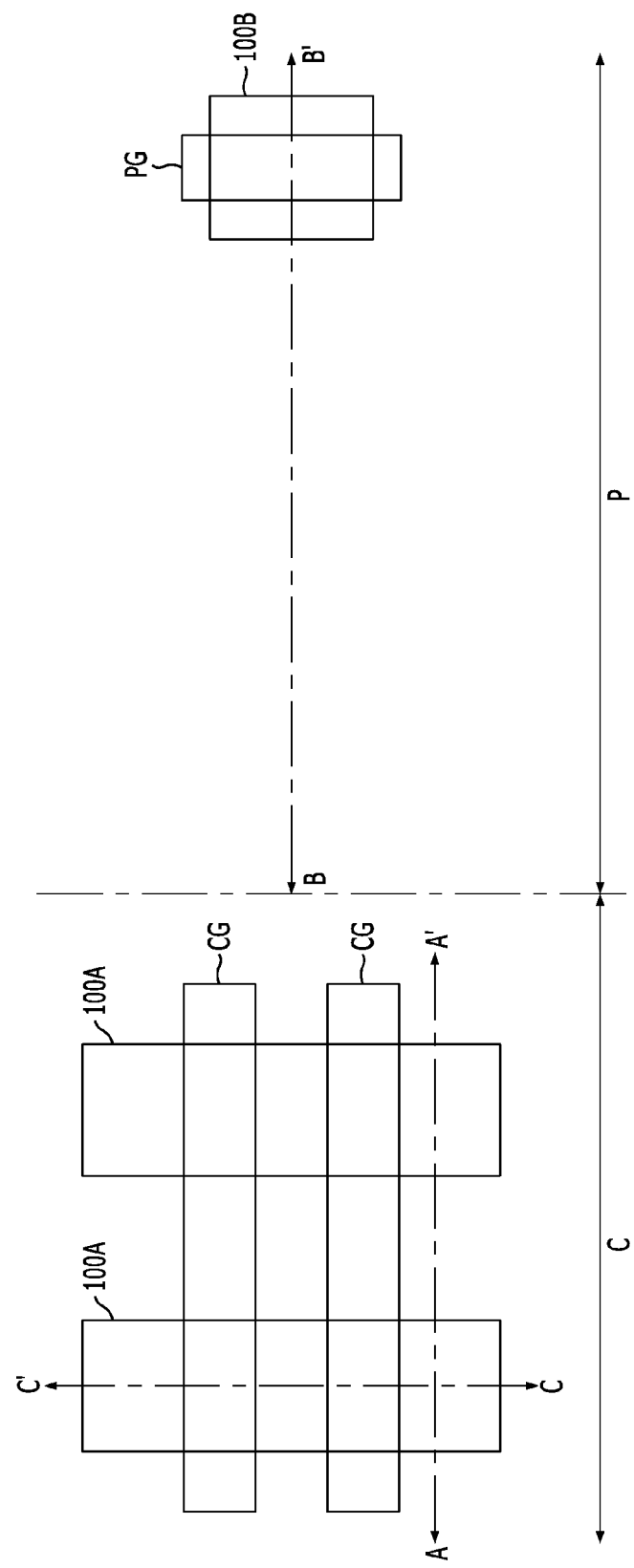

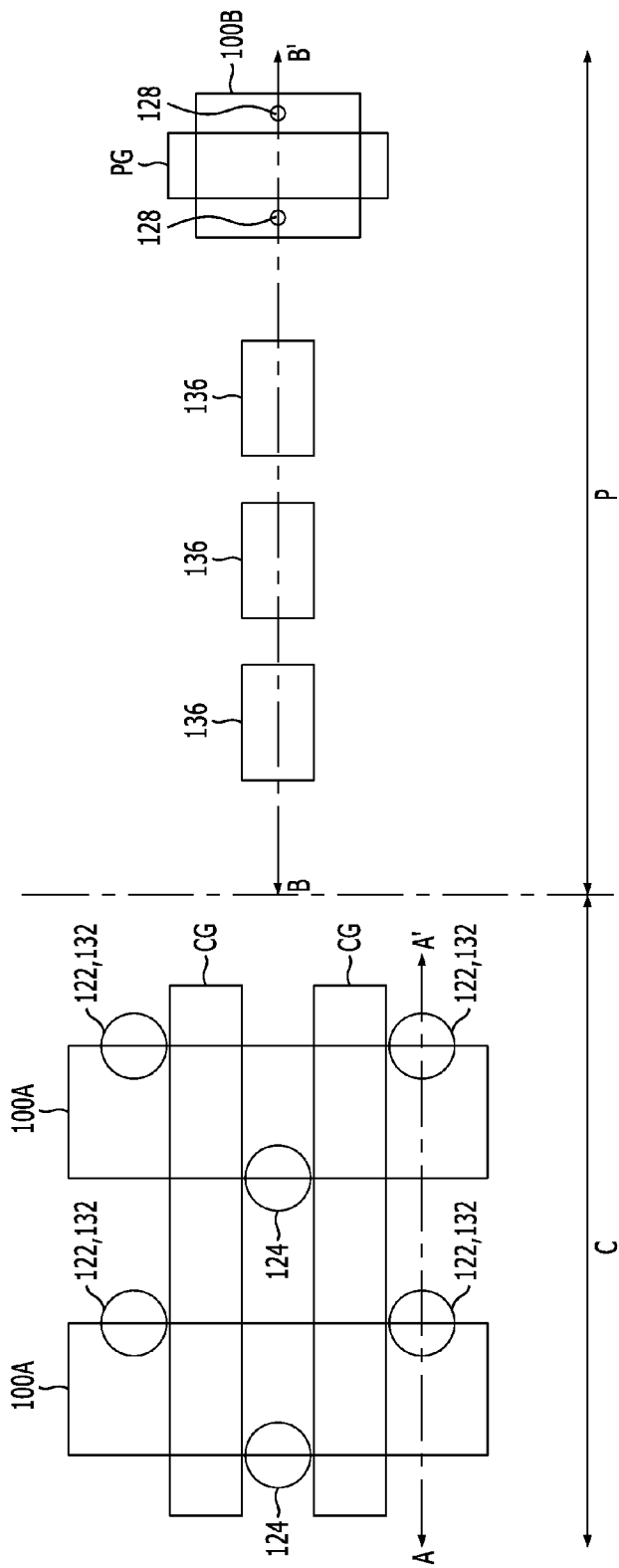

ELECTRONIC DEVICE AND METHOD FOR FABRICATING THE SAME

CROSS-REFERENCE TO RELATED APPLICATIONS

This patent document claims priority of Korean Patent Application No. 10-2014-0028323, entitled "ELECTRONIC DEVICE AND METHOD FOR FABRICATING THE SAME" and filed on Mar. 11, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which is capable of improving data sensing characteristics, reducing an area of a device and simplifying fabricating processes.

In one aspect, there is provided an electronic device including a semiconductor memory which includes a first region in which a first variable resistance element for storing data is disposed; and a second region in which a reference resistance element for sensing data stored in the first variable resistance element is disposed, and wherein the reference resistance element includes: a plurality of second variable resistance elements formed of the same material at the same level as the first variable resistance element; a plurality of contacts coupled to each of the second variable resistance elements; and a first pad to couple two adjacent second variable resistance elements with each other so that the first pad is coupled to a part of the contacts which are coupled to one of the two adjacent second variable resistance elements and a part of the contacts which are coupled to the other of the two adjacent second variable resistance elements for coupling the two adjacent second variable resistance elements with each other.

In some implementations, the first and second variable resistance elements that are coupled to the contacts form a chain, and the reference resistance element further includes: a second pad coupled to the contact which is coupled to the second variable resistance elements positioned at both sides of the chain and is not coupled to the first pad, and coupled to an external line which is outside of the reference resistance element. In some implementations, the first region further includes a lower contact coupled to a lower end of the first variable resistance element, an upper contact coupled to an upper end of the first variable resistance element, and a line coupled to an upper end of the upper contact, the contacts are formed of the same material at the same level as the upper contact, and the first pad is formed of the same material at the same level as the line. In some implementations, each of the first and second variable resistance elements includes a first ferromagnetic layer, a second ferromagnetic layer and a tunnel barrier layer interposed between the first ferromagnetic layer and the second ferromagnetic layer. In some implementations, the first region further includes a switching element which is positioned at a lower level than the first and second variable resistance elements and is coupled to the first variable resistance element. In some implementations, the second region further includes an element which is positioned at a lower level than the second variable resistance elements and overlaps with a region in which the reference resistance element is formed. In some implementations, the second variable resistance elements and the element are insulated from each other. In some implementations, the first region is in a cell array region, and the second region is in a peripheral circuit region. In some implementations, the first and second regions are in a cell array region.

In another aspect, there is provided an electronic device comprising a semiconductor memory which includes: a substrate structure; a memory cell array formed over the substrate and including first variable resistance elements as memory cells each coupled to have a variable resistance value for storing data; and a reference resistance element formed over the substrate and including second variable resistance elements each coupled to exhibit a fixed resistance value as part of a reference resistance value in sending a resistance state of a first variable resistance element of the memory cell array, each second variable resistance element being configured to have the same materials and layer structure as each first variable resistance element in the memory cell array.

In some implementations, each second variable resistance element is configured to have the same materials and layer structure as each first variable resistance element in the memory cell array and is fabricated by the same processing and at the same time for fabricating each first variable resistance element in the memory cell array.

In some implementations, the reference resistance element includes: second variable resistance elements formed at the same level as the first variable resistance element; contacts coupled to each second variable resistance elements; first pads each coupled to one ends of the contacts of which the other ends are respectively coupled to different second variable resistance elements from each other; and second pads arranged opposite each other on the sides of the reference resistance element to provide a connection to an external line, wherein each second pad is coupled to one of the contact which is connected with one of the second variable resistance elements. In some implementations, the number, the size, or the arrangement of the second variable resistance elements, the contacts, the first pads, or the second pads are structured to produce a desired fixed resistance value of the reference resistance element.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, there is provided a method of manufacturing an electronic device including semiconductor memory, comprising providing a substrate in which a first region and a second region are defined; forming a first variable resistance element and a plurality of second variable resistance elements in the first region and the second region over the substrate, respectively; forming a plurality of contacts coupled to each of the second variable resistance elements; and forming a first pad to couple two adjacent second variable resistance elements with each other in a manner that the first pad is coupled to part of the contacts which are coupled to one of two adjacent second variable resistance elements and a part of the contacts which are coupled to the other of the two adjacent second variable resistance elements.

In some implementations, the first and second variable resistance elements that are coupled to the contacts form a chain, and the method further comprises forming a second pad coupled to the contact which is coupled to the second variable resistance element positioned at both sides of the chain and is not coupled to the first pad; and using the second pad to provide a connection to an external line. In some implementations, the method further comprises forming a lower contact coupled to a lower end of the first variable resistance element, an upper contact coupled to an upper end of the first variable resistance element, and a line coupled to an upper end of the upper contact, in the first region, and wherein the contacts and the upper contact are formed together with each other, and wherein the first pad and the line are formed together with each other. In some implementations, the forming of the first and second variable resistance elements comprises forming a first ferromagnetic layer, a tunnel barrier layer and a second ferromagnetic layer; and patterning the first ferromagnetic layer, the tunnel barrier layer and the second ferromagnetic layer. In some implementations, the method further comprises forming a switching element at a lower level than the first variable resistance element to be coupled to an the first variable resistance element. In some implementations, the method further comprises forming an element in the second region at a lower level than the second variable resistance elements to at least partially overlaps with a region in which the second variable resistance elements are formed.

These and other aspects, implementations and associated advantages are described in greater detail in the drawings, the description and the claims.

DETAILED DESCRIPTION

Figure 1B:
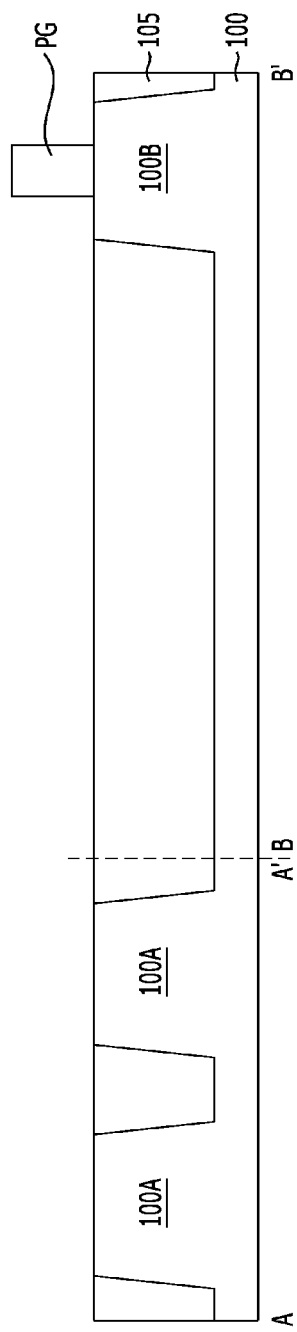
FIGS. 1A to 4B illustrate a semiconductor device and a method for fabricating the same in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor device in accordance with an implementation may include a cell array region in which a plurality of memory cells are disposed and/or a peripheral circuit region in which various circuits for driving the cell array region are disposed. A variable resistance element having a characteristic switched between different resistance states according to an applied voltage or current may be used as the memory cell. In this case, a reference resistance element for sensing data stored in the variable resistance element may be disposed in the cell array region or the peripheral circuit region. The sensing can be performed by setting a resistance value of the reference resistance element to a value between a low resistance value and a high resistance value of the variable resistance element, determining that the variable resistance element is in a high resistance state when a resistance value of the variable resistance element is higher than that of the reference resistance element, and determining that the variable resistance element is in a low resistance state when a resistance value of the variable resistance element is lower than that of the reference resistance element.

In the above semiconductor device, since the resistance value of the reference resistance element is used as a fixed-value reference to determine the resistance state of the variable resistance element, it is very important to fix the resistance value of the reference resistance element. If the resistance value of the reference resistance element is not fixed, a resistance state of the variable resistance element may be determined inaccurately. However, in a conventional technology or other circuit designs, the resistance value of the reference resistance element may be changed by fabrication processes of fabricating a semiconductor device. In this implementation, a scheme for implementing a reference resistance element which can have a fixed resistance value is provided. Hereinafter, a detailed description is provided below with reference to drawings.

FIGS. 1A to 4B illustrate a semiconductor device and a method for fabricating the same in accordance with an implementation. FIGS. 1A, 2A, 3A and 4A are plan views. FIGS. 1B, 2B, 3B and 4B are cross-sectional views taken along lines A-A' and B-B' of FIGS. 1A, 2A, 3A and 4A, respectively. FIG. 1C is a cross-sectional view taken along line C-C' of FIG. 1A.

First, an example of the fabrication method is described.

Figure 1C:
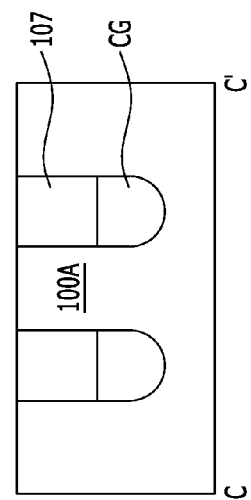

Referring to FIGS. 1A to 1C, a semiconductor substrate 100 is provided to include a first region C and a second region P. A plurality of memory cells including variable resistance elements may be disposed in the first region C, and a reference resistance element used for sensing data of the variable resistance elements may be disposed in the second region P. The first region C may be in a cell array region, and the second region P may be in a peripheral circuit region. In addition to the reference resistance element, various peripheral circuit elements may be further disposed in the second region P.

An isolation layer 105 may be formed in the semiconductor substrate 100 to define one or more first active regions 100A in the first region C and a second active region 100B in the second region P. The isolation layer 105 may be formed by etching the semiconductor substrate 100 excluding the first and second active regions 100A and 100B to a predetermined depth to form isolation trenches and burying the isolation trenches with an insulating layer such as oxide, nitride, etc.

The first active region 100A may have a line shape extended in a first direction parallel to line C-C'. The first active regions 100A may be arranged to be spaced apart from each other along a second direction parallel to line A-A'. The second active region 100B may be provided to form a peripheral circuit element such as a peripheral circuit transistor. The number, the shape and the arrangement of the first and second active regions 100A and 100B may be changed in various manners and are not limited to the implementation shown in the drawings.

One or more cell gates CG for forming one or more cell transistors may be formed in the first region C and a peripheral circuit gate PG for forming a peripheral circuit transistor may be formed in the second region P.

The cell gate CG may extend in the second direction crossing the first active regions 100A. The cell gates CG may be arranged to be spaced apart from each other along the first direction. Further, the cell gate CG may be buried in the semiconductor substrate 100. In this case, the cell gate CG may be formed through the following processes: the first active region 100A and the isolation layer 105 disposed in the regions in which the cell gates CG are to be formed are selectively etched to form gate trenches extending in the second direction, a gate dielectric layer (not illustrated) is formed on inner walls of the gate trenches, and a conductive material such as metal or metal nitride is buried in parts of the gate trenches. Next, a capping layer 107 protecting the cell gate CG may be formed by filling the other parts of the gate trenches in which the cell gates CG are formed with an insulating material. Although not shown, junctions doped with impurities may be formed in the first active region 100A at both sides of the cell gate CG. The cell gate CG and the junctions positioned at both sides of the cell gate CG may form a cell transistor. This cell transistor may function as a switching element which is coupled to an end of a variable resistance element and controls whether or not a current or voltage is supplied to the variable resistance element. In this implementation, a junction between two adjacent cell gates CG may function as a common source region, and junctions positioned at both sides of the two adjacent cell gates CG may function as drain regions.

The peripheral circuit gate PG may be disposed over the semiconductor substrate 100 and across the second active region 100B. A gate dielectric layer (not illustrated) may be interposed between the peripheral circuit gate PG and the second active region 100B. Although not shown, junctions doped with impurities may be formed in the second active region 100B at both sides of the peripheral circuit gate PG. One of the junctions may function as a source region and the other of the junctions may function as a drain region. The peripheral circuit gate PG and the junctions positioned at both sides of the peripheral circuit gate PG may form a peripheral circuit transistor. This peripheral circuit transistor may perform various functions as needed.

The process of forming the cell transistor and the peripheral circuit transistor may involve a high-temperature process to activate impurities of the junctions.

Figure 2B:
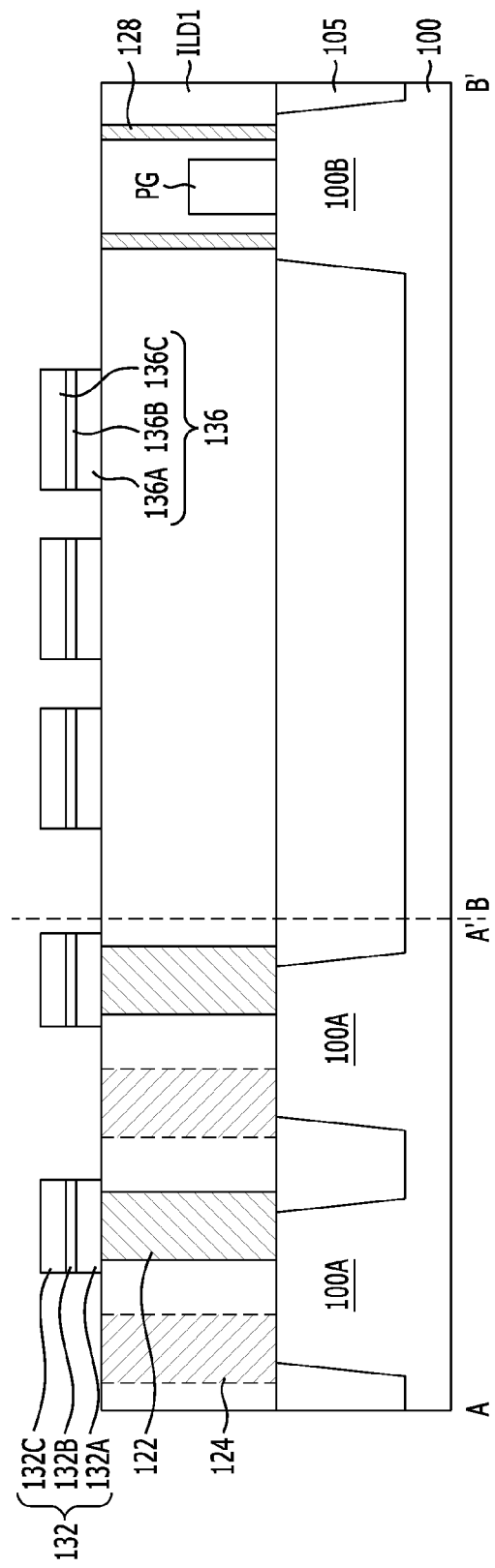

Referring to FIGS. 2A and 2B, a first interlayer dielectric layer ILD1 may be formed to cover the resultant structure of FIGS. 1A to 1C. The first interlayer dielectric layer ILD1 may include an oxide.

The first interlayer dielectric layer ILD1 of the first region C is selectively etched to form contact holes which expose a part of the first active region 100A. The contact holes are filled with a conductive material to form first contacts 122 and second contacts 124. As shown in FIG. 2B, the first contacts 122 and the second contacts 124 penetrate through the first interlayer dielectric layer ILD1 and are coupled to the part of the first active region 100A. Referring to FIG. 2A, a first contact 122 may be coupled to a corresponding first active region 100A positioned at one side of a cell gate CG to form, for example, the drain region of a transistor. A second contact 124 corresponding to the above first contact 122 and the particular first active region 100A may be coupled to the first active region 100A positioned on the other side of the corresponding cell gate along the first direction parallel to line C-C' to form the source region of the above mentioned transistor. This arrangement is repeated for the different first active regions 100A (such as two adjacent first active regions 100A shifted in position along the second direction parallel to line A-A' shown in FIG. 2A) and different cell gates (such as two adjacent cell gates shifted in position along the first direction parallel to line C-C') to form an array of such transistors. Therefore, the first contacts 122 may be coupled to the first active regions 100A positioned at two opposite sides of two adjacent cell gates CG, for example, the drain regions. The second contacts 124 may be coupled to the first active regions 100A positioned between the two adjacent cell gates CG, for example, the common source regions. In a transistor in FIG. 2A where the first contact 122 is disposed over one side of the first active region 100A in the second direction, for example, a right side, and second contact 124 is disposed over the other side of the active region 100A in the second direction, for example, a left side, a sufficient distance between a bit line which is to be formed over the first contact 122 and a source line which is to be formed over the second contact 124 may be obtained.

FIG. 2B shows a cross sectional view along the line A-A' in FIG. 2A where the second contacts 124 are not present but are, represented by regions in dotted lines for convenience of explanation. FIG. 2B also shows third contact holes 128 formed on two opposite sides of the gate PG and in contact with the underlying active region 100B in each peripheral circuit region P.

The first interlayer dielectric layer ILD1 of the second region P is selectively etched to form a contact hole which exposes the second active region 100B. The contact hole is filled with a conductive material to form a third contact 128. The third contact 128 penetrates through the first interlayer dielectric layer ILD1 and is coupled to the second active region 100B. The third contact 128 may be coupled to each of junctions positioned at both sides of the peripheral circuit gate PG.

In implementations, the processes of forming the first contact 122, the second contact 124 and the third contact 128 may be performed at the same time so that the first contact 122, the second contact 124 and the third contact 128 may be formed together.

Next, a first variable resistance element 132, which is coupled to the first contact 122, may be formed over the first interlayer dielectric layer ILD1 of the first region C (the cell array region). Such a first variable resistance element 132 in the first region C is used to store data and may switch between different resistance states according to a voltage or current applied thereto. The voltage or current is applied to the first variable resistance element 132 through the first contact 122 coupled to a lower end of the variable resistance element and a fourth contact coupled to an upper end of the variable resistance element (refer to 142 of FIGS. 3A and 3B). The first variable resistance element 132 may be formed of a monolayer or multilayer including various materials used for RRAM, PRAM, FRAM and the like. Such materials may include, for example, a metal oxide such as transition metal oxide or perovskite-based material, a phase change material such as chalcogenide-based material, a ferroelectric material, or a ferromagnetic material and the like. In one implementation, the first variable resistance element 132 may include a magnetic tunnel junction (MTJ) including a first ferromagnetic layer 132A, a tunnel barrier layer 132B, and a second ferromagnetic layer 132C. In this case, any one of the first and second ferromagnetic layers 132A and 132C may serve as a pinned layer of which the magnetization direction is pinned, and the other one may serve as a free layer of which the magnetization direction is changed. For example, the first and second ferromagnetic layers 132A and 132C may be formed of a monolayer or multilayer including Fe—Pt alloy, Fe—Pd alloy, Co—Pd alloy, Co—Pt alloy, Fe—Ni—Pt alloy, Co—Fe—Pt alloy, Co—Ni—Pt alloy or the like. The tunnel barrier layer 132B may change the magnetization direction of the free layer by the tunneling of electrons, and may be formed of a monolayer or multilayer including oxides such as MgO, CaO, SrO, TiO, VO, or NbO.

Also, a second variable resistance element 136 may be formed over the first interlayer dielectric layer ILD1 of the second region P which is a peripheral circuit region. The second variable resistance element 136 may be formed of the same material at the same level as the first variable resistance element 132. For example, the second variable resistance element 136 may include a first ferromagnetic layer 136A, a tunnel barrier layer 136B and a second ferromagnetic layer 136C. Two or more second variable resistance elements 136 may be formed in the second region P. However, different from the first variable resistance element 132 for storing data in the first region C, the second variable resistance element 136 does not function as a memory device by itself because there is not an element for supplying a voltage or current to the second variable resistance element 136 for effectuating the operation of the two resistance states but is configured to form part of a reference resistance element for providing a reference in reading out a corresponding first variable resistance element 132 for storing data in the first region C. Two or more second variable resistance elements 136 may be provided in a region in which a reference resistance element is to be formed.

The layers and materials in the layers of the first and second variable resistance elements 132 and 136 may be the same to simplify the fabrication process so that the processes of forming the first variable resistance element 132 and the second variable resistance element 136 may be performed at the same time. That is, the first and second variable resistance elements 132 and 136 may be formed together by depositing a variable resistance material over the first interlayer dielectric layer ILD1 and patterning the variable resistance material. In some implementations, the plane shape of the second variable resistance element 136 may be different from the plane shape of the first variable resistance element 132.

Figure 3A:
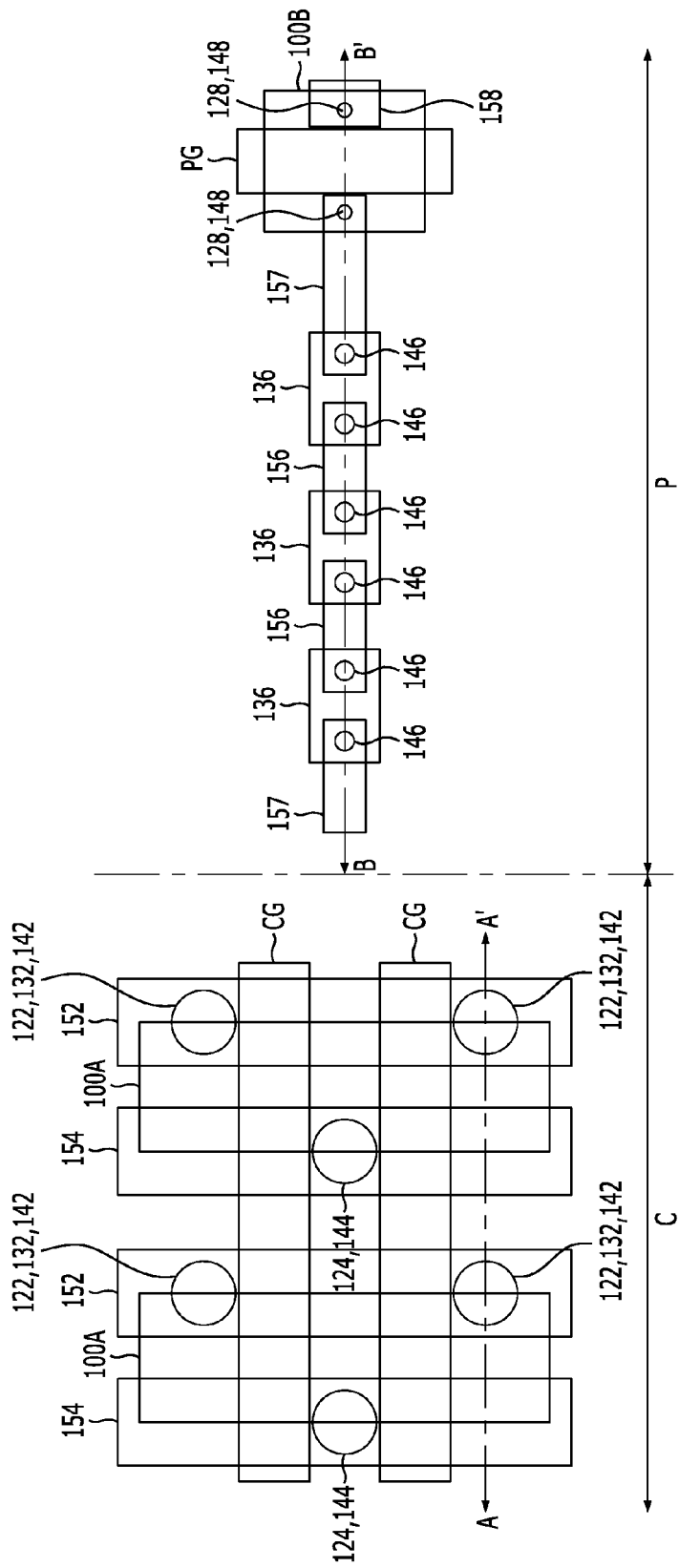
Figure 3B:
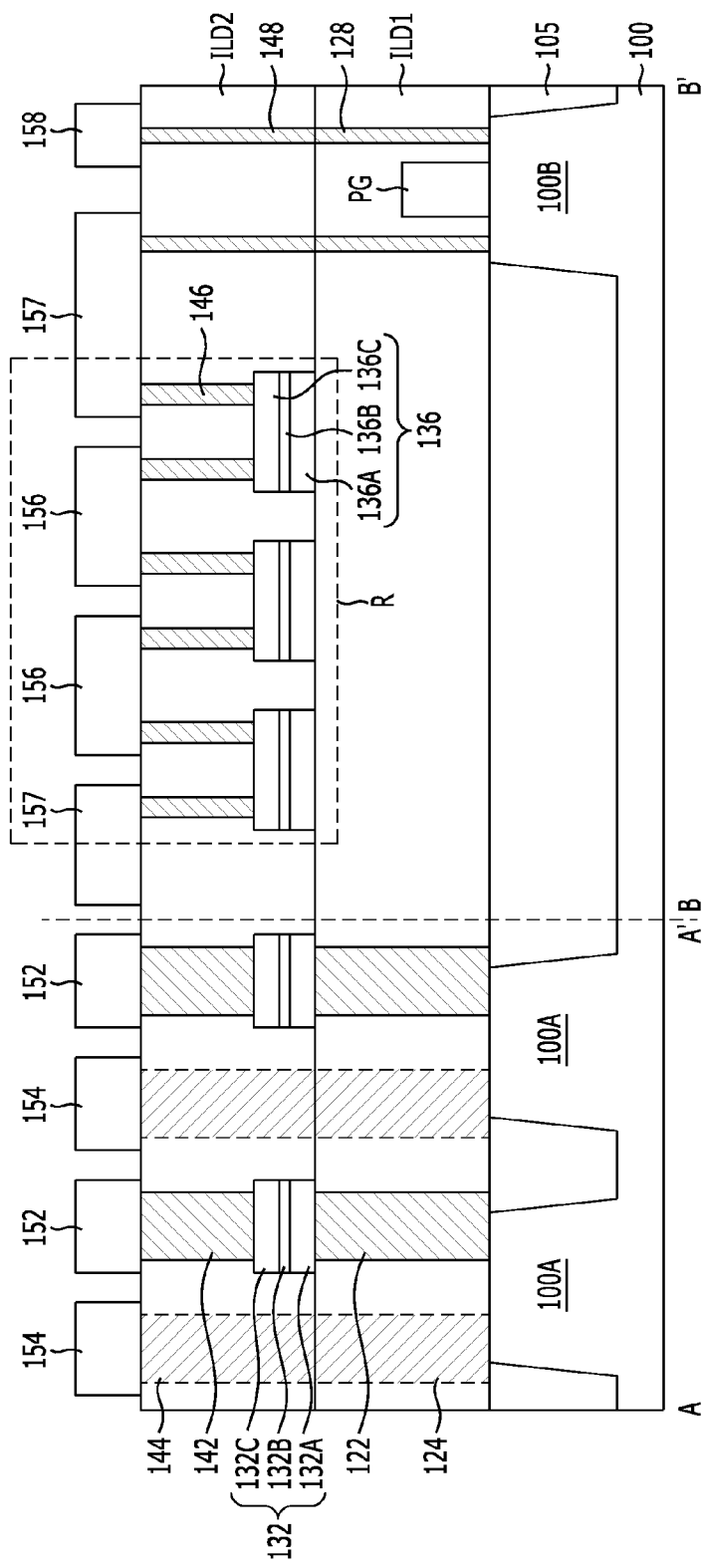

Referring to FIGS. 3A and 3B, a second interlayer dielectric layer ILD2 may be formed to cover the resultant structure of FIGS. 2A and 2B.

Then, a fourth contact 142 and a fifth contact 144 which penetrate through the second interlayer dielectric layer ILD2 of the first region C may be formed. The fourth contact 142 and the fifth contact 144 are coupled to the first variable resistance element 132 and the second contact 124, respectively. Although the fifth contact 144 is invisible in FIG. 3b, the fifth contact 144 is represented by a dotted line for convenience of explanation.

Also, a sixth contact 146 and a seventh contact 148 which penetrate through the second interlayer dielectric layer ILD2 of the second region P may be formed. The sixth contact 146 and the seventh contact 148 are coupled to the second variable resistance element 136 and the third contact 128, respectively. Here, two or more sixth contacts 146 may be provided over each of the second variable resistance elements 136. Although two sixth contacts 146 are coupled to one second variable resistance element 136 in FIGS. 3A and 3B, other implementations are also possible. For example, three or more sixth contacts 146 may be coupled to one second variable resistance element 136.

The fourth to seventh contacts 142, 144, 146 and 148 may be formed at the same time.

Next, a bit line 152 and a source line 154 may be formed over the second interlayer dielectric layer ILD2 of the first region C. The bit line 152 may extend in the first direction to be coupled to the fourth contacts 142 which are arranged along the first direction, and the source line 154 may extend in the first direction to be coupled to the fifth contacts 144 which are arranged along the first direction. In this implementation, even if the bit line 152 and the source line are formed at the same level, a sufficient distance can be secured between the bit line 152 and the source line 154 to prevent an electrical bridge between the bit line 152 and the source line 154. This is because the elements formed under the bit line 152, for example, the first and the fourth contacts 122 and 142 and the variable resistance element 132, and the elements formed under the source line 154, for example, the second and fifth contacts 124 and 144, are spaced apart from each other in the second direction.

Also, first to third pads 156, 157 and 158 may be formed over the second interlayer dielectric layer ILD2 of the second region P. The first to third pads 156, 157 and 158 may be coupled to the sixth contact 146 and/or the seventh contact 148. For convenience of explanation, the first pad 156 may be a pad which is coupled to only the sixth contact 146, the second pad 157 may be a pad which is coupled to the sixth contact 146 and another element, for example, the seventh contact 148, and the third pad 158 may be a pad which is coupled to only the seventh contact 148. A pad may be formed of a conductive material in order to connect a lower element disposed under the pad to an upper element disposed over the pad. The pad may have various plane shapes without being limited to a certain shape.

The first pad 156 may provide a connection between two adjacent second variable resistance elements 136 by being coupled to a part of the sixth contacts 146 which are coupled to one second variable resistance element 136 and a part of the sixth contacts 146 which are coupled to another second variable resistance element 136 adjacent to the one second variable resistance element 136. That is, the first pad 156 is coupled to the sixth contacts 146, which are, in turn, coupled to the two adjacent second variable resistance elements 136. Thus, the first pad 156 connects the two adjacent second variable resistance elements 136 with each other through the sixth contacts 146. In this case, the second variable resistance elements 136 and the first pads 156 that are connected through the sixth contacts 146 may form a chain or a chain-shaped structure. For example, two first pads 156 including the left first pad 156 and the second first pad 156 and three second variable resistance elements 136 including the left second variable resistance element 136 and the middle second variable resistance element 136 and the right second variable resistance element 136 are illustrated in FIGS. 3A and 3B. The left first pad 156 is connected to the two sixth contacts 146 at the left and right sides thereof. The sixth contact 146 connected to the left first pad 156 at the left side is disposed over a right side of the left second variable resistance element 136 and the right sixth contact 146 connected to the left first pad 156 at the right side is disposed over a left side of the middle second variable resistance elements 136. The left first pad 156 overlaps or connects the left second variable resistance element 136 and the middle second variable resistance elements 136 through the sixth contacts 146. In the similar manner, the right first pad 156 is connected to the two six contacts 146 at the left and right sides thereof. The sixth contact 146 connected to the right first pad 156 at the left side is disposed over a right side of the middle second variable resistance elements 136, and the sixth contact 146 connected to the right first pad 156 at the right side is disposed over a left side of the right second variable resistance elements 136. The right first pad 156 overlaps or connects the middle second variable resistance element 136 and the right second variable resistance elements 136 through the sixth contacts 146.

The second variable resistance elements 136 positioned at both ends of the chain-shaped structure may be connected to an external line through the sixth contacts 146 and the second pad 157. For example, the left second variable resistance element 136 and the right second variable resistance elements 136 may be coupled to the second pad 157 through the sixth contacts 146. The sixth contacts 146 which are coupled to the left variable resistance element or the right second variable resistance element 136 and not coupled to the first pad 156 may be coupled to the second pad 157.

The second variable resistance elements 136 is configured as part of the reference resistance element R for reading the resistance state of a corresponding first variable resistance element 132. This aspect of the second variable resistance elements 136 is explained below. In the example in FIG. 3B, the second variable resistance elements 136, the sixth contacts 146, the first pads 156 and the second pads 157 form a reference resistance element R. In this example, a lower end of the second variable resistance element 136 is not coupled to an element that supplies a voltage or current to the element 136. Different from the first variable resistance element 132, each second variable resistance element 136 is configured to have its lower end to be in contact with the first interlayer dielectric layer ILD1 to function as a conductor having a predetermined resistance value. A resistance value of the reference resistance element R may be determined depending on the number, the area and/or the arrangement of the second variable resistance elements 136, the sixth contacts 146, the first pads 156 and the second pads 157.

The seventh contacts 148 are connected to both ends of the peripheral circuit transistor. One of the seventh contacts 148 is coupled to the second pad 157 and the other of the seventh contacts 148 is coupled to the third pad 158. In one implementation, when an end of the reference resistance element R and an end of the peripheral circuit transistor are connected to the same voltage supplier, the end of the reference resistance element R and the end of the peripheral circuit transistor may be coupled to the same second pad 157. In another implementation, however, the end of the reference resistance element R and the end of the peripheral circuit transistor may be coupled to different second pads 157 from each other.

The bit line 152, the source line 154 and the first to third pads 156, 157 and 158 may be formed at the same time. In this case, the bit line 152, the source line 154 and the first to third pads 156, 157 and 158 may be formed by depositing a conductive material such as a metal, a metal nitride, etc over the second interlayer dielectric layer ILD2 and patterning the conductive material.

Figure 4A:
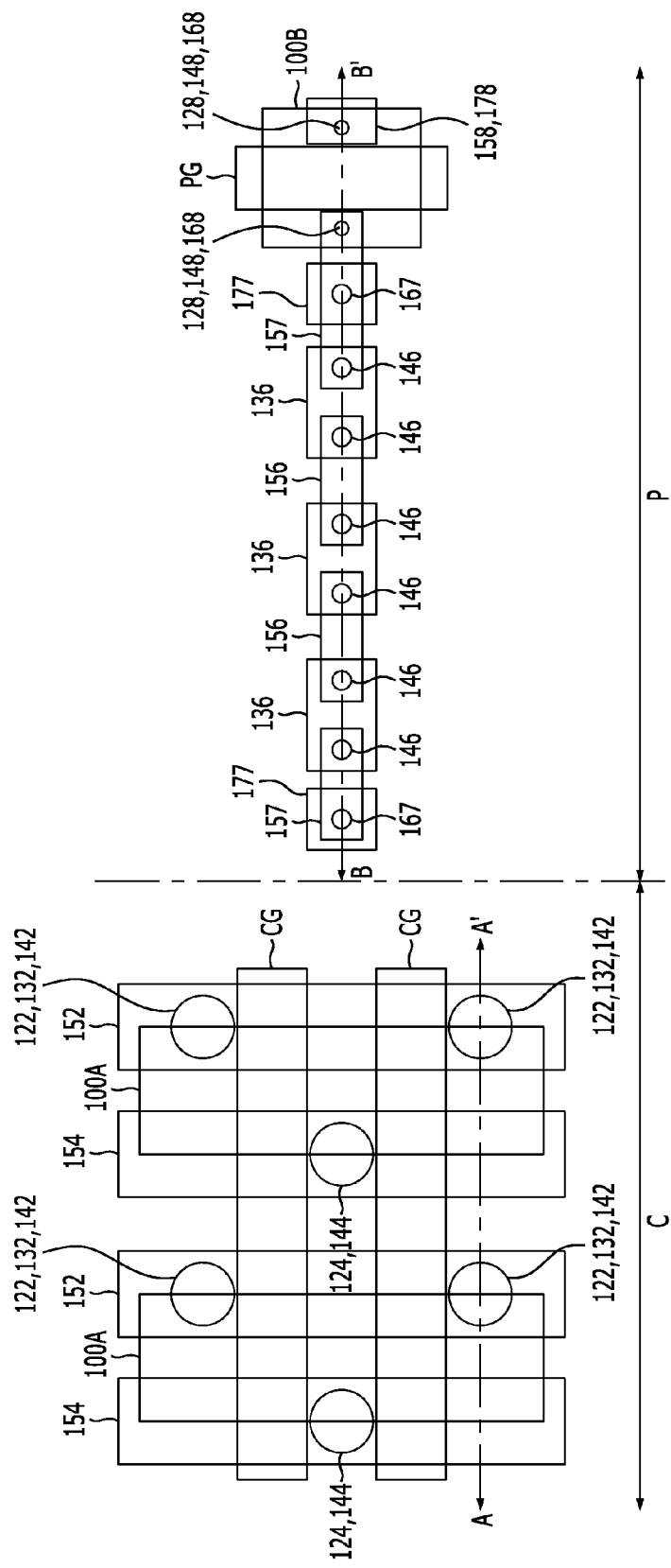
Figure 4B:
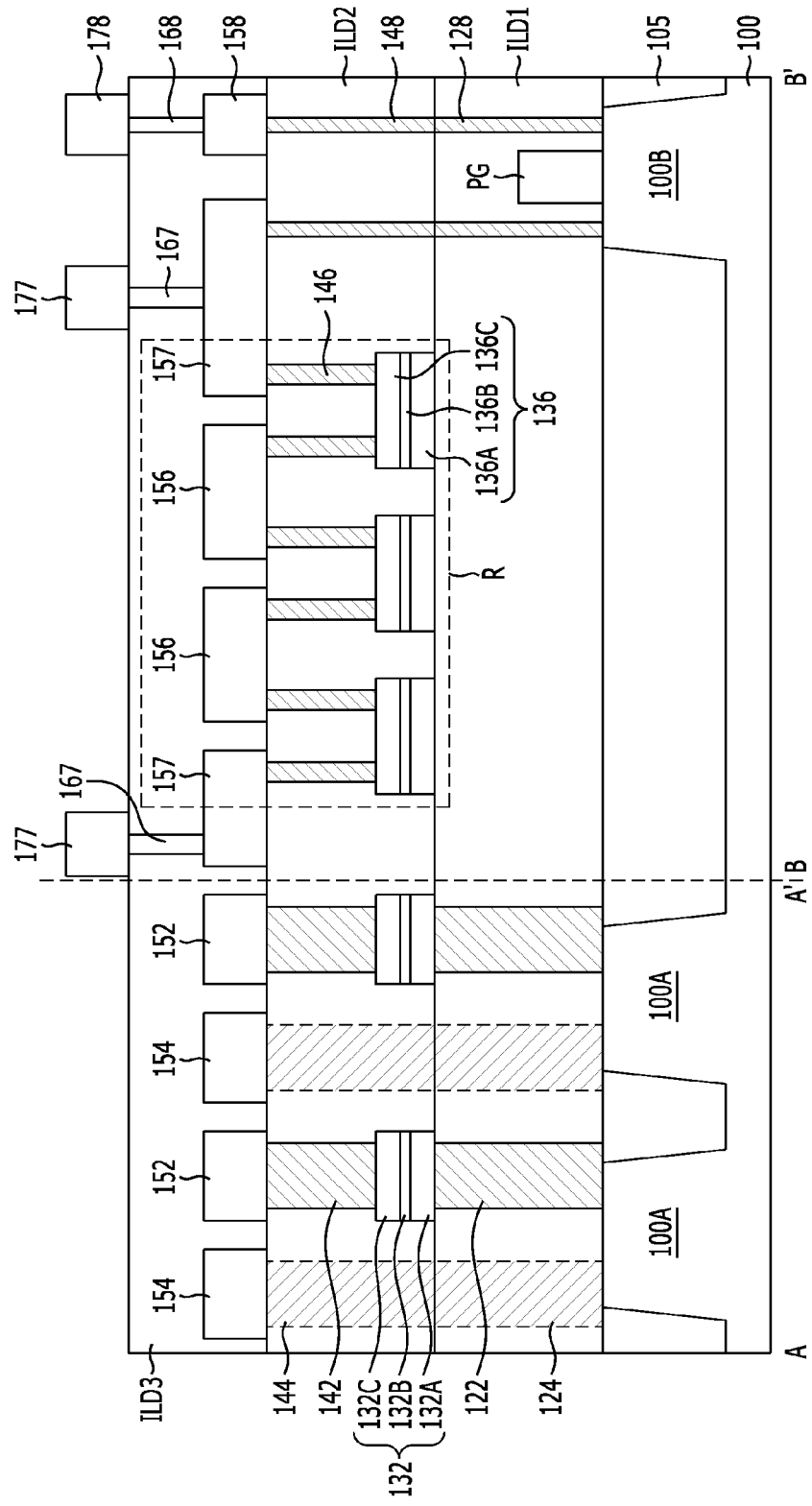

Referring to FIGS. 4A and 4B, a third interlayer dielectric layer ILD3 may be formed to cover the resultant structure of FIGS. 3A and 3B.

Then, an eighth contact 167 and a ninth contact 168 may be formed, which penetrate through the third interlayer dielectric layer ILD3 of the second region P and are coupled to the second pad 157 and the third pad 158, respectively. Then, a fourth pad 177 and a fifth pad 178 may be formed over the third interlayer dielectric layer ILD3, The fourth and fifth pads 177 and 178 are coupled to the eighth contact 167 and the ninth contact 168, respectively. The eighth contact 167 and the fourth pad 177 may connect both ends of the reference resistance element R to external lines, and may have various shapes and arrangements in a plane view. Also, the eighth contact 167 and the fourth pad 177 may be coupled to an end of the peripheral circuit transistor. The ninth contact 168 and the fifth pad 178 may connect the other end of the peripheral circuit transistor with external lines.

Although now shown, a contact and/or a pad may be formed to couple to the bit line 152 and the source line 154 of the first region C.

Subsequent processes, for example, forming additional contacts, pads and/or lines are performed to complete the fabrication of the semiconductor device and the explanations thereon will be omitted herein.

Through the above-described processes, the semiconductor device illustrated in FIGS. 4A and 4B may be fabricated.

Referring again to FIGS. 4A and 4B, the semiconductor device may include the first region C in which the first variable resistance element 132 functions as a memory cell, and the second region P in which the reference resistance element R is disposed to provide a reference for reading out the first variable resistance element 132. As described above, the first region C may be in a cell array region, and the second region P may be in a peripheral circuit region.

The first variable resistance element 132 may switch between different resistance states according to an applied voltage or current through the first contact 122 and the fourth contact 142 to store data. The first contact 122 and the fourth contact 142 are coupled to the lower end and the upper end of the first variable resistance element 132, respectively.

The reference resistance element R may include two or more second variable resistance elements 136 and corresponding sixth contacts 146 and the first pads 156. The second variable resistance elements 136 are formed of the same material as the first variable resistance element 132 and are positioned at the same level as the first variable resistance element 132 in a direction vertical to the semiconductor substrate 100. The sixth contacts 146 are coupled to the upper end of each second variable resistance element 136. The first pads 156 are coupled to upper ends of the sixth contacts 146 and connects two adjacent second variable resistance elements 136. Furthermore, the reference resistance element R may include the second pad 157 coupled to upper ends of the sixth contacts 146 which are not coupled to the first pad 156 and connecting the second variable resistance elements 136 with an external line. Each of the first pads 156 may couple the two adjacent second variable resistance elements 136 with each other. Each of the first pads 156 may be coupled to two six contacts 146 that are respectively coupled to one and the other of the two adjacent second variable resistance elements 136. For example, the first pad is connected to a part of the contacts 146 which are coupled to one second variable resistance element 136 and a part of the contacts 146 which are coupled to another second variable resistance element 136 adjacent to the one second variable resistance element 136. The second pad 157 may be coupled to the sixth contacts 146 which are coupled to the second variable resistance elements 136 positioned at both ends of the chain-shaped structure and are not coupled to the first pad 156. The second pad 157 may connect the second variable resistance elements 136 positioned at both ends of the chain-shaped structure with external lines as required. The sixth contacts 146 may be formed of the same material at the same level as the fourth contact 142. The first and second pads 156 and 157 may be formed of the same material at the same level as the bit line 152 and the source line 154.

Additional peripheral circuit elements such as a transistor may be further disposed in the second region P.

The above-described semiconductor device and the method for fabricating the same may provide the following advantages.

First, since the reference resistance element R is formed using a series of processes including the process of forming the first variable resistance element 132 and the subsequent processes, a resistance value of the reference resistance element R can be substantially stable. Since the materials, layer structures and the fabrication of each second variable resistance element 136 in the reference resistance element R and the first variable resistance element 132 are the same, the resistance values of each second variable resistance element 136 the first variable resistance element 132 are subject to the same changes or variations caused by the common materials and fabrication process. As a result, the relative value of the resistance values of each second variable resistance element 136 the first variable resistance element 132 is stable. For the conventional reference resistance element which is formed using an active region without the above properties of the reference resistance element R based on the disclosed technology, there has been a problem that a resistance value of the reference resistance element changes during fabricating processes. For example, a high-temperature thermal treatment process for activating impurities of junctions of a transistor affects the resistance value of the reference resistance element. However, based on the disclosed technology, the reference resistance element R is formed after a high-temperature process is performed (so is each second variable resistance element within the reference resistance element R). Accordingly, the change in the resistance value of the reference resistance element R can be prevented or reduced.

Also, since a large area is not needed for obtaining a required resistance value of the reference resistance element R, a degree of integration may be increased. In other reference resistance element designs, since a resistance value of the reference resistance element is determined depending on an area of an active region, the area of the active region needs to satisfy at least a certain size in order to obtain a required resistance value. However, in an implementation based on the disclosed technology, since the resistance value of the reference resistance element R is determined depending on the number, the size of an area and/or the arrangement of the second variable resistance elements 136, the sixth contact 146, the first pad 156 or the second pad 157, various modifications can be made in terms of a layout or the size of an area. Specially, by including the contacts, for example, the sixth contacts 146, which have a relatively small width and a relatively high resistance as a portion of the reference resistance element R, an area needed for obtaining a required resistance value may be greatly reduced. because the disclosed technology enable a large number of contacts to be disposed in a small area while having a desired high resistance.

Furthermore, since the reference resistance element R is fabricated by the same process for fabricating the memory cell (the first variable resistance element 132), additional processes are not required for forming the reference resistance element R. This leads to cost reduction and simplification in processes. As illustrated in the examples above, the reference resistance element R may be formed together with the first variable resistance element 132, the fourth contact 142, the bit line 152, and the like.

Figure 5A:
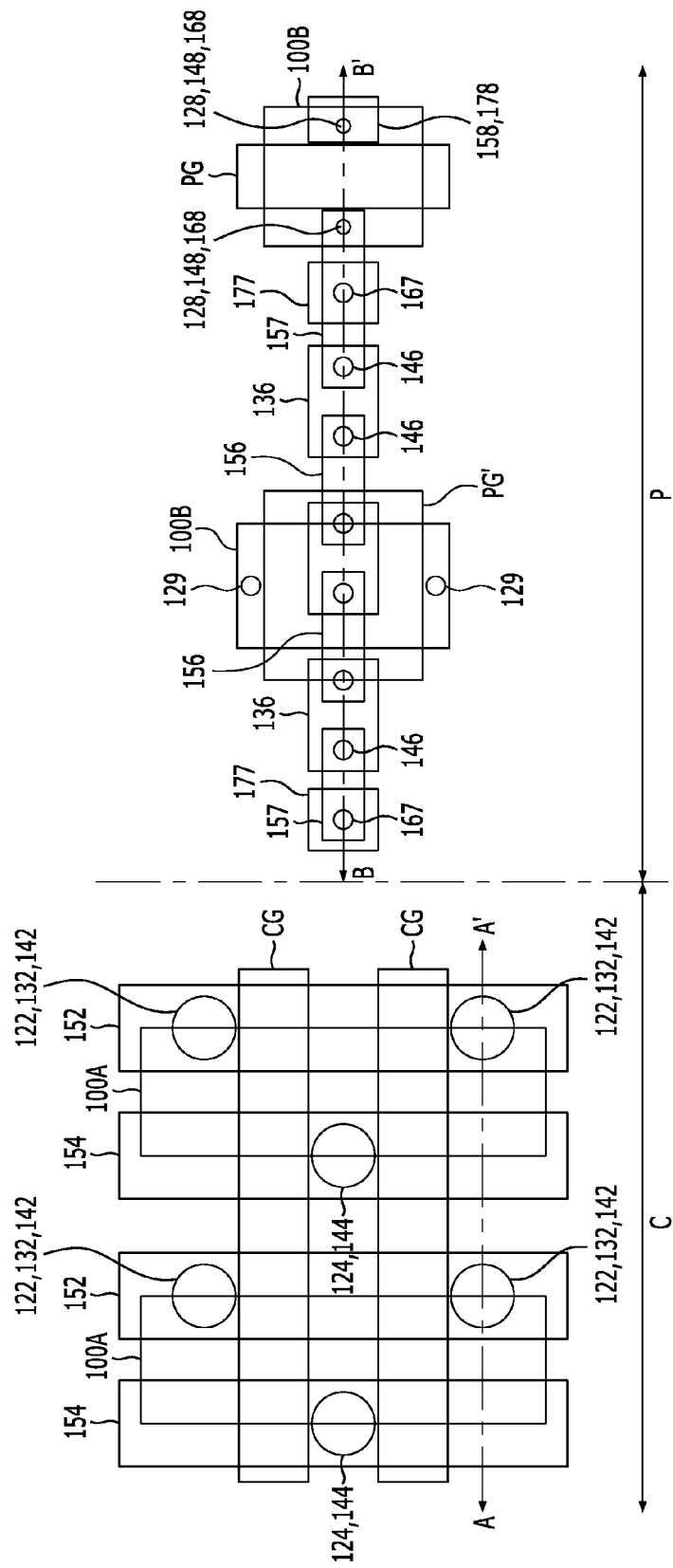
FIGS. 5A and 5B illustrate a semiconductor device in accordance with another implementation.
Figure 5B:
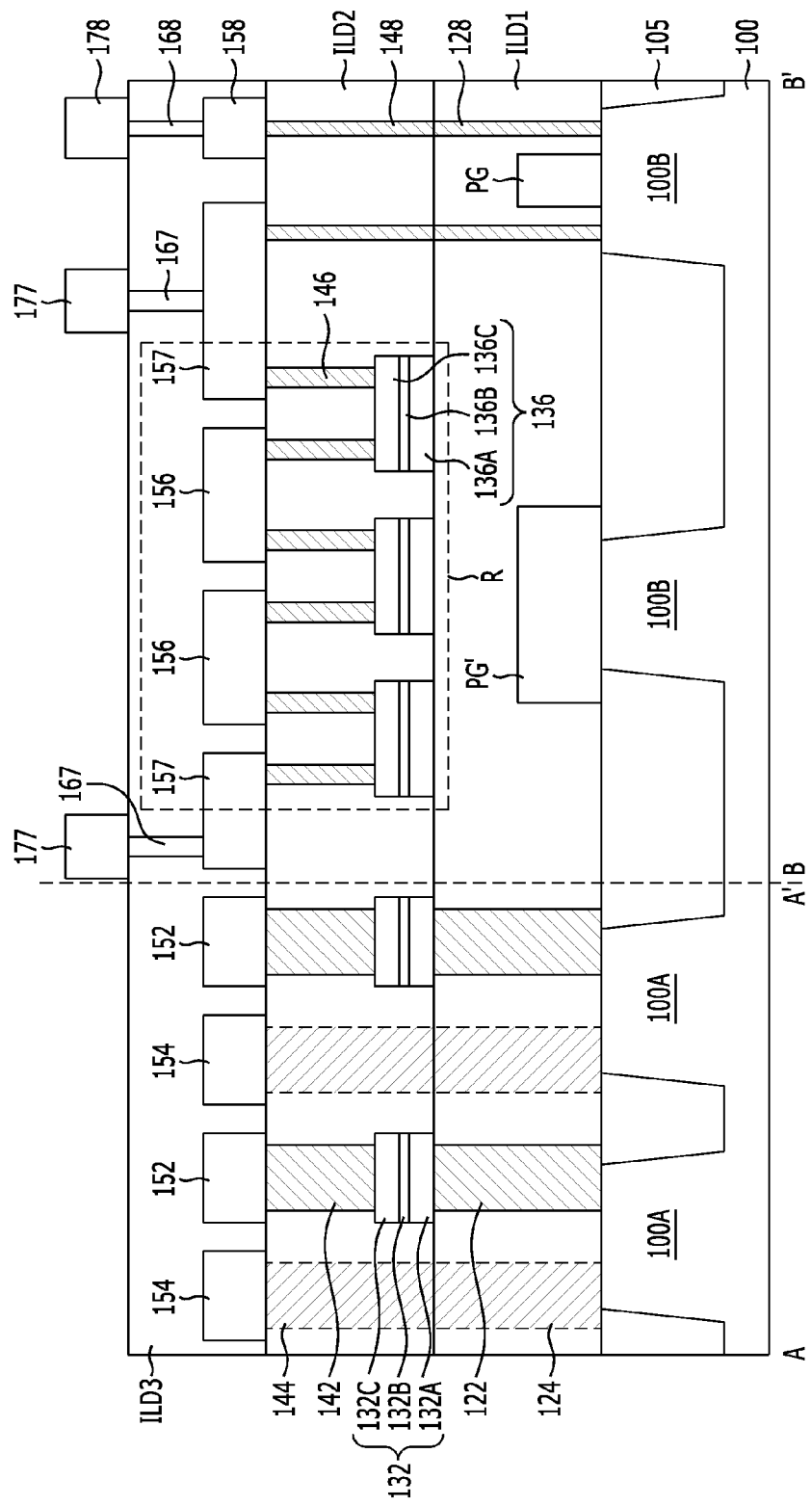

Meanwhile, in the above-described implementation, only the first interlayer dielectric layer ILD1 exists under the second variable resistance elements 136 of the second region P because there is no need to connect lower ends of the second variable resistance elements 136 with another element. Therefore, a space disposed under the second variable resistance elements 136 may be used for various elements, for example, a peripheral circuit element. In this case, a degree of integration may be further increased. The second variable resistance elements 136 and the peripheral circuit element disposed under the second variable resistance elements 136 may be insulated from each other by the second interlayer dielectric layer ILD2. By doing so, they are independent from each other. FIGS. 5A and 5B show an example including an additional element which is formed under the second variable resistance elements.

FIGS. 5A and 5B illustrate a semiconductor device in accordance with another implementation. The differences between the present implementation and the above-described implementations are mainly discussed in the following descriptions.

Referring to FIGS. 5A and 5B, an additional peripheral circuit element, for example, an additional peripheral circuit transistor may be disposed under the second variable resistance elements 136. The region where an additional peripheral circuit element is disposed at least partially overlaps with a region in which the reference resistance element R is formed.

The additional peripheral circuit transistor may include a second active region 100B, a peripheral circuit gate PG' disposed over the second active region 100B, and junctions positioned at both sides of the peripheral circuit gate PG'. Since the junctions positioned at both sides of the peripheral circuit gate PG' may be connected with external lines, the junctions may not overlap with the reference resistance element R. For example, when the second variable resistance elements 136 are arranged along the second direction as shown in FIGS. 5A and 5B, the junctions may be positioned at both sides of the peripheral circuit gate PG' in the first direction. The junctions may be connected with external lines through a contact 129 which is disposed over the junctions.

In this implementation, the peripheral circuit transistor is illustrated as an element that is formed under the second variable resistance element. However, other implementations are also possible. That is, various kinds of elements may be formed under the second variable resistance elements 136 while at least partially overlapping with a region in which the reference resistance element R is formed.

In the above-described implementations, the first region C is in a cell array region, and the second region P is in a peripheral circuit region. However, other implementations are also possible. For example, both the first region C and the second region P may be in the cell array region. That is, both the first variable resistance element 132 serving as a memory cell and the reference resistance element R used for sensing data stored in the first variable resistance element 132 may be formed in the cell array region. In this case, since a distance between the first variable resistance element 132 and the reference resistance element R is close, it is possible to improve operating characteristics of the semiconductor device. For example, a speed of data sensing can be increased. Also, in this case, there may be a space under the reference resistance element R as similar to the implementation of FIGS. 5A and 5B. Therefore, various kinds of elements, which are required to be formed in the cell array region, may be further disposed under the second variable resistance elements 136 while at least partially overlapping with a region in which the reference resistance element R is formed.

As is apparent from the above descriptions, in the semiconductor device and the method for fabricating the same in accordance with the implementations, it is possible to improve data sensing characteristics, reduce an area of the device and simplifying fabricating processes of the device.

The above and other memory circuits or semiconductor devices based on the disclosed technology can be used in a range of devices or systems. FIGS. 6-10 provide some examples of devices or systems that can implement the memory circuits disclosed herein.

Figure 6:
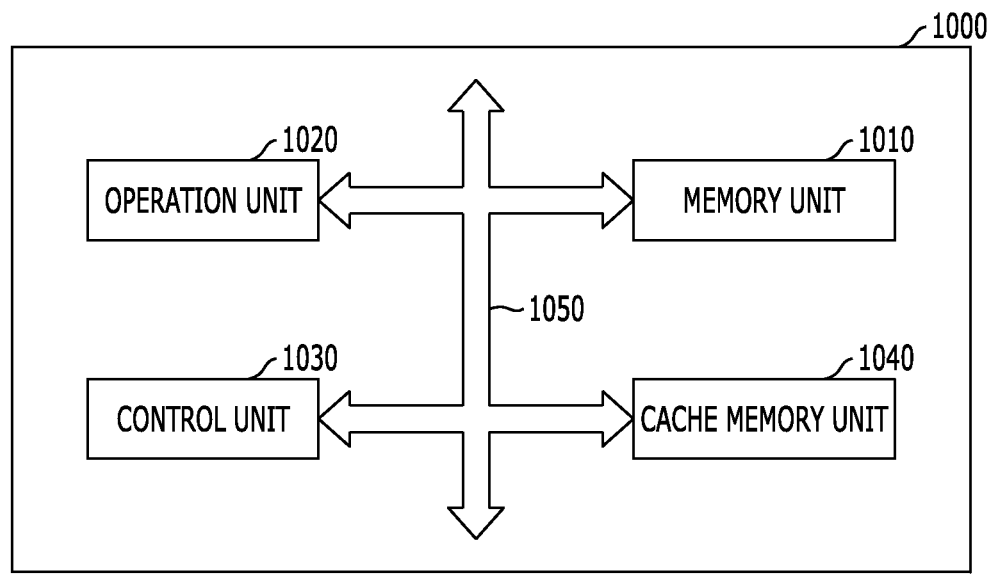
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the memory unit 1010 may be improved, and reducing an area and simplifying fabricating processes of the memory unit 1010 may be possible. As a consequence, operating characteristics of the microprocessor 1000 may be improved and a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
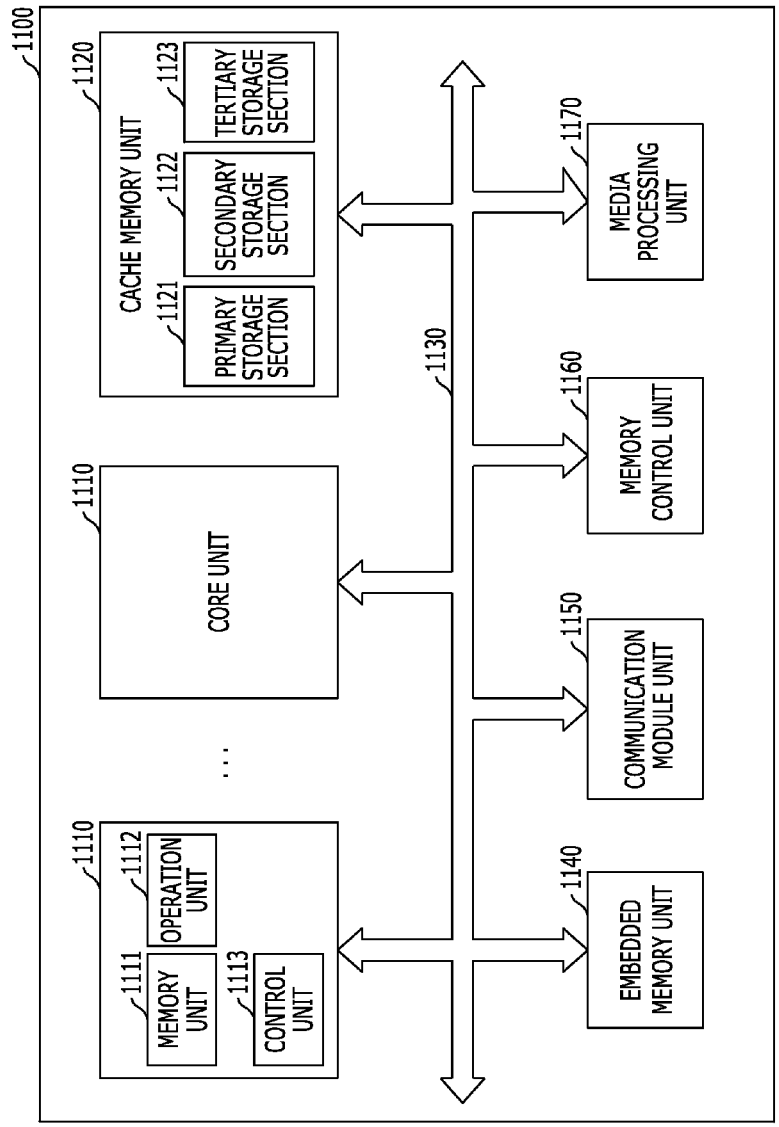
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the cache memory unit 1120 may be improved, and reducing an area and simplifying fabricating processes of the cache memory unit 1120 may be possible. As a consequence, operating characteristics of the processor 1100 may be improved, and a size of the processor 1100 may be reduced.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
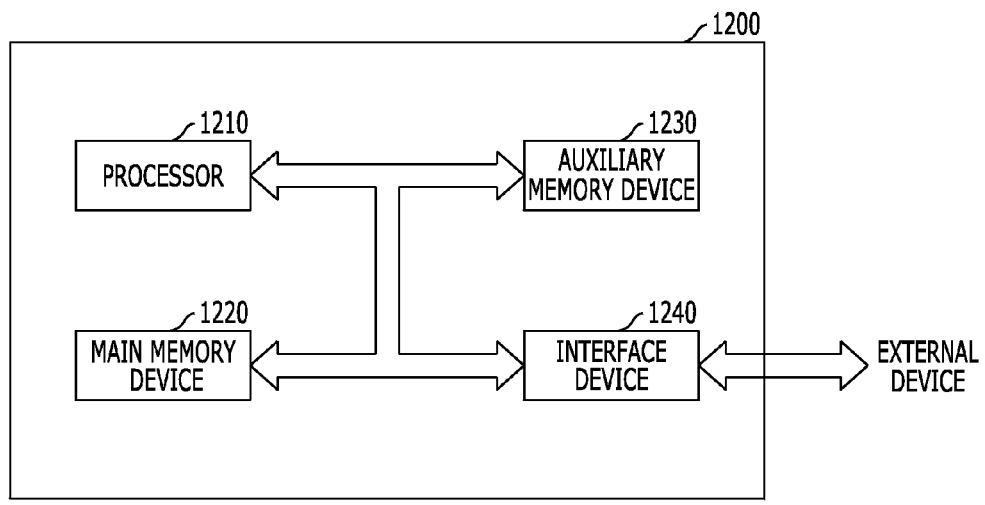
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the main memory device 1220 may be improved, and reducing an area and simplifying fabricating processes of the main memory device 1220 may be possible. As a consequence, operating characteristics of the system 1200 may be improved, and a size of the system 1000 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the auxiliary memory device 1230 may be improved, and reducing an area and simplifying fabricating processes of the auxiliary memory device 1230 may be possible. As a consequence, operating characteristics of the system 1200 may be improved, and a size of the system 1000 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
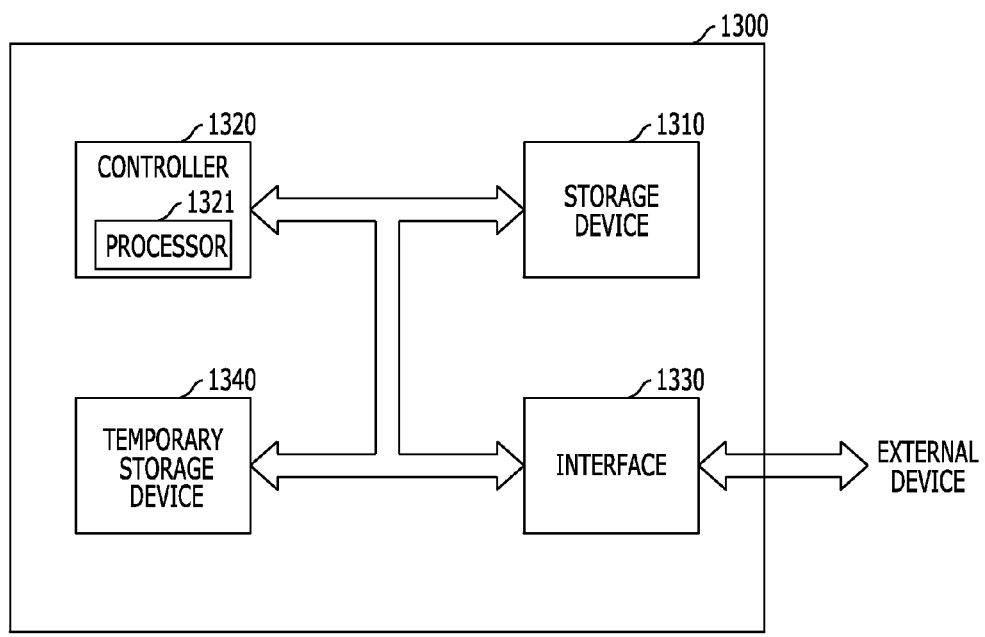
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the temporary storage device 1340 may be improved, and reducing an area and simplifying fabricating processes of the temporary storage device 1340 may be possible. As a consequence, operating characteristics of the data storage system 1300 may be improved, and a size of the data storage system 1300 may be reduced.

Figure 10:
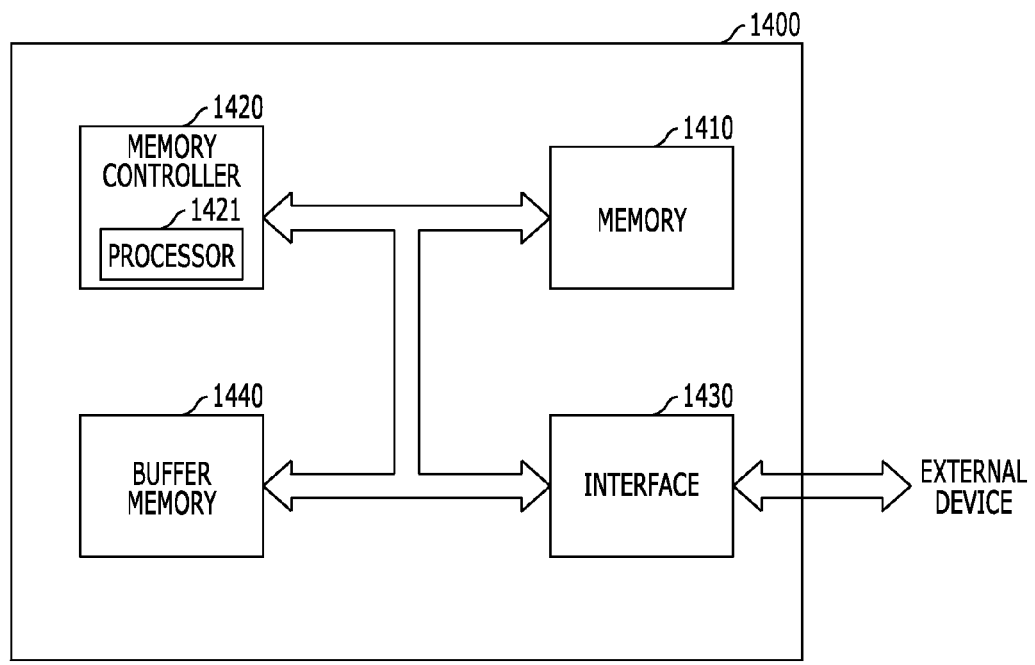
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the memory 1410 may be improved, and reducing an area and simplifying fabricating processes of the memory 1410 may be possible. As a consequence, operating characteristics of the memory system 1400 may be improved and a size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first region in which a first variable resistance element for storing data is disposed; and a second region in which a reference resistance element for sensing data stored in the first variable resistance element is disposed, and wherein the reference resistance element comprising: a plurality of second variable resistance elements formed of the same material at the same level as the first variable resistance element; a plurality of contacts coupled to each of the second variable resistance elements; and a first pad coupled to part of the contacts which are coupled to one of two adjacent second variable resistance elements and part of the contacts which are coupled to the other of the two adjacent second variable resistance elements for coupling the two adjacent second variable resistance elements with each other. Through this, data sensing characteristics of the buffer memory 1440 may be improved, and reducing an area and simplifying fabricating processes of the buffer memory 1440 may be possible. As a consequence, operating characteristics of the memory system 1400 may be improved and a size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory which comprises:
   a first region in which a first variable resistance element structured to exhibit different resistance states for storing data is disposed; and
   a second region in which a reference resistance element for sensing data stored in the first variable resistance element is disposed, and
   wherein the reference resistance element includes:
   a plurality of second variable resistance elements formed of the same material at the same level as the first variable resistance element, wherein the second variable resistance elements are coupled to provide a reference in resistance, without exhibiting different resistance states, in sensing a resistance of the first variable resistance element to determined stored data in the first variable resistance element;
   a plurality of contacts coupled to each of the second variable resistance elements; and
   a first pad to couple two adjacent second variable resistance elements with each other so that the first pad is coupled to a part of the contacts which are coupled to one of the two adjacent second variable resistance elements and a part of the contacts which are coupled to the other of the two adjacent second variable resistance elements.

2. The electronic device of claim 1, wherein the first pad and the second variable resistance elements that are coupled to the contacts form a chain, and
   the reference resistance element further includes:
   a second pad coupled to the contact which is coupled to the second variable resistance elements positioned at both sides of the chain and is not coupled to the first pad, and coupled to an external line which is outside of the reference resistance element.

3. The electronic device of claim 1, wherein the first region further includes a lower contact coupled to a lower end of the first variable resistance element, an upper contact coupled to an upper end of the first variable resistance element, and a line coupled to an upper end of the upper contact,
   the contacts are formed of the same material at the same level as the upper contact, and
   the first pad is formed of the same material at the same level as the line.

4. The electronic device of claim 1, wherein each of the first and second variable resistance elements includes a first ferromagnetic layer, a second ferromagnetic layer and a tunnel barrier layer interposed between the first ferromagnetic layer and the second ferromagnetic layer.

5. The electronic device of claim 1, wherein the first region further includes a switching element which is positioned at a lower level than the first and second variable resistance elements and is coupled to the first variable resistance element.

6. The electronic device of claim 1, wherein the second region further includes an element which is positioned at a lower level than the second variable resistance elements and at least partially overlaps with a region in which the reference resistance element is formed.

7. The electronic device of claim 6, wherein the second variable resistance elements and the element are insulated from each other.

8. The electronic device of claim 1, wherein the first region is in a cell array region, and the second region is in a peripheral circuit region.

9. The electronic device of claim 1, wherein the first and second regions are in a cell array region.

10. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

11. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

12. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

13. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

14. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

15. An electronic device comprising a semiconductor memory which includes:
a substrate structure;
a memory cell array formed over the substrate and including first variable resistance elements as memory cells each coupled to have a variable resistance value for storing data; and
a reference resistance element formed over the substrate and including second variable resistance elements each coupled to exhibit a fixed resistance value as part of a reference resistance value in sensing a resistance state of a first variable resistance element of the memory cell array, each second variable resistance element being coupled to provide a fixed resistance value as a reference in resistance, without exhibiting different resistance states, and being configured to have the same materials and layer structure as each first variable resistance element in the memory cell array.

16. The electronic device of claim 15, wherein the reference resistance element includes:
second variable resistance elements formed at the same level as the first variable resistance elements.

17. The electronic device of claim 15, wherein:
layers of a second variable resistance element are at the same levels with respect to the substrate as corresponding layers of a first resistance element, respectively, and
materials in the layers of the second variable resistance element are identical to materials of the corresponding layers of the first resistance element, respectively.

18. The electronic device of claim 17, wherein
each second variable resistance element is fabricated by the same processing and at the same time for fabricating each first variable resistance element in the memory cell array.

19. The electronic device of claim 15, wherein the reference resistance element includes:
- contacts coupled to each second variable resistance elements;
- first pads each coupled to one ends of the contacts of which the other ends are respectively coupled to different second variable resistance elements from each other; and
- second pads arranged opposite each other on the sides of the reference resistance element to provide a connection to an external line, wherein each second pad is coupled to one of the contact which is connected with one of the second variable resistance elements.

20. The electronic device of claim 19, wherein the number, the size, or the arrangement of the second variable resistance elements, the contacts, the first pads, or the second pads are structured to produce a desired fixed resistance value of the reference resistance element.

* * * * *